(12) United States Patent
Lin

(10) Patent No.: US 6,757,186 B2
(45) Date of Patent: Jun. 29, 2004

(54) METHOD AND LOGIC DECISION DEVICE FOR GENERATING FERRO-ELECTRIC CAPACITOR REFERENCE VOLTAGE

(75) Inventor: Chin-Hsi Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/104,420

(22) Filed: Mar. 22, 2002

(65) Prior Publication Data

US 2003/0094957 A1 May 22, 2003

(30) Foreign Application Priority Data

Nov. 16, 2001 (TW) ........................................ 90128445 A

(51) Int. Cl.$^7$ .............................................. G11C 11/22
(52) U.S. Cl. ........................................ 365/145; 365/149
(58) Field of Search .............................. 324/678, 676, 324/111, 189.07; 365/145, 149

(56) References Cited

U.S. PATENT DOCUMENTS 5,796,648 A * 8/1998 Kawakubo et al. ......... 365/145

* cited by examiner

*Primary Examiner*—Albert Decady
*Assistant Examiner*—James Kerveros
(74) *Attorney, Agent, or Firm*—J. C. Patents

(57) ABSTRACT

A method of producing a reference voltage through a ferro-electric capacitor. A ferro-electric capacitor for determining logic level of data is charged so that the amount of electric charges within the ferro-electric capacitor is between the amount of electric charges signifying logic '1' and the amount of electric charges signifying logic '0'. The electric charges are transferred to a capacitor so that a voltage is produced. The voltage produced by the capacitor is used as a reference for accurately determining logic level of data.

2 Claims, 6 Drawing Sheets

METHOD AND LOGIC DECISION DEVICE FOR GENERATING FERRO-ELECTRIC CAPACITOR REFERENCE VOLTAGE

CROSS-REFERENCE TO RELATED APPLICATION

This application claims the priority benefit of Taiwan application serial No. 90128445, filed Nov. 16, 2001.

BACKGROUND OF THE INVENTION

1. Field of Invention

The present invention relates to a method of generating a reference voltage. More particularly, the present invention relates to a method and logic decision device for generating a ferro-electric capacitor reference voltage.

2. Description of Related Art

A conventional method of generating a reference voltage is to use a pair of dummy cells. FIG. 1 is a schematic circuit diagram for producing a reference voltage through a pair of dummy cells 102 and 104. If the dummy cell 102 has an operating voltage of V1 volts and the dummy cell 102 has an operating voltage of V2 volts, reference voltage of the structure in FIG. 1 is (V1+V2)/2 volts. In other words, a voltage greater than (V1+V2)/2 volts is designated as logic '1' and a voltage smaller than (V1+V2)/2 is designated as logic '0'. However, since each capacitor has a slightly different electrical characteristic, the ferro-electric capacitor 110 inside the dummy cell 102 is charged at most to a voltage V3, where V3<V1. Similarly, the ferro-electric capacitor 112 is charged at most to a voltage V4, where V4<V2. Therefore, the actual reference voltage is (V3+V4)/2. A voltage V5 between the voltage (V1+V2)/2 and (V3+V4)/2, is smaller than (V1+V2)/2 and hence should be regarded as being at a logic '0'. However, because of the capacitor property, the voltage V5 is actually compared with the reference voltage (V3+V4)/2. Since V5 is greater than (V3+V4)/2, this results in a logic '1'. When this occurs, an incorrect logical decision between '0' and '1' is produced. Such erroneous logical decision due to a variation in ferro-electric capacitor property often leads to an edge effect.

Another conventional method of generating a reference voltage is to use a pair of different parasitic capacitors. FIG. 2 is a circuit diagram showing a method of deploying the voltage differential between a pair of different bit lines to produce a reference voltage. FIG. 3 is graph showing the variation between voltage and electric charge of the ferro-electric capacitor in the circuit shown in FIG. 2. The circuit shown in FIG. 2 is capable of a revolving edge effect due to a variation of capacitor property. Assume the bit line 204 has an overall length greater than the bit line 208; in other words, assume the parasitic capacitance 206 is greater than the parasitic capacitance 210. Also assume data electric charges Q1 waiting for logical decision sit inside the ferro-electric capacitor 202. First, the data charges Q1 waiting for logical decision is transferred to the parasitic capacitor 206 of the bit line 240. Since V=Q/C, a voltage V1 is produced. The charge/voltage inside the ferro-electric capacitor changes from point $P_1$ to $P_2$ following path A as shown in FIG. 3.

Thereafter, reference electric charges Q2 that represent logic '0' are stored inside the ferro-electric capacitor 202. The charge/voltage inside the ferro-electric capacitor change from $P_2$ to $P_3$ following path B as shown in FIG. 3.

Reference electric charges Q2 that represent logic '0' are stored inside the parasitic capacitor 210 generated by the bit line 208. The charge/voltage inside the ferro-electric capacitor changes from $P_3$ to $P_2$ following path C as shown in FIG. 3. Since V=Q/C, voltage produced by the parasitic capacitor 210 serves as a reference voltage V2.

After logical decision of the waiting data, the original electric charges Q1 waiting for a logical decision are returned to the ferro-electric capacitor 202. The charge/voltage inside the ferro-electric capacitor change from $P_2$ to $P_1$ via points $P_3$ and $P_4$ following path D as shown in FIG. 3.

Since V1 is greater than V2, the parasitic capacitor 206 is greater than the parasitic capacitor 210. Within a definite range, V1 is definitely greater than V2. That is, data logic '1' is quite obvious. Therefore, the method is very clear about the logic decision and is able to avoid edge effect problems due to a variation in capacitor property.

In brief, using identical ferro-electric capacitors for access but using a differential voltage due to the parasitic capacitor resulting from an extra length of between bit line 208 and 206 is able to avoid edge effect problem due to a variation in capacitor property. Within a definite range, logic level can be very accurately determined. Although edge effects can be avoided, other problems arise. The extra length in the bit line tends to increase volume occupation of the integrated circuit.

FIG. 4 is a schematic circuit diagram showing a system that uses an auxiliary device to produce a voltage differential and hence a reference voltage. Operating principals of the circuit are identical to the circuit shown in FIG. 2. The only difference is that an auxiliary device instead of bit lines of different overall length is used to generate the differential voltage. As before, the auxiliary device tends also to increase volume occupation of the integrated circuit.

In short, conventional methods of generating a reference voltage lead to the following problems:

1. Edge effects due to a variation of capacitor properties; and
2. Excessive volume occupation by the integrated circuit.

SUMMARY OF THE INVENTION

Accordingly, one object of the present invention is to provide a method of producing a reference voltage using ferro-electric capacitors so that problems in a conventional reference voltage provider such as edge effects and substantial volume occupation are reduced.

To achieve these and other advantages and in accordance with the purpose of the invention, as embodied and broadly described herein, the invention provides a method of generating a reference voltage using a ferro-electric capacitor. A ferro-electric capacitor is charged so that the amount of electric charges within the ferro-electric capacitor is between the amount of electric charges for logic '1' and the amount of electric charges for logic '0'. The electric charges are transferred to a capacitor so that a voltage is produced. The voltage produced by the capacitor is the reference voltage. The reference voltage is used to determine the logic level of data. The aforementioned ferro-electric capacitor and a ferro-electric capacitor for holding data waiting for a logical decision are identical.

This invention also provides a logic decision device that uses a reference voltage. The logic decision device includes a ferro-electric capacitor, a first transistor, a second transistor, a third transistor, a fourth transistor, a first bit line, a second bit line and a micro-sensor amplifier. The ferro-electric capacitor generates a reference voltage. The first transistor is coupled to the ferro-electric capacitor serving as a switch. The second transistor is coupled to the first transistor serving as a switch. The third transistor is coupled to the first transistor and the second transistor serving as a switch. The fourth transistor is coupled to the third transistor serving as a switch. The first bit line is coupled to the second transistor serving as a parasitic capacitor. The second bit line is coupled to the third transistor and the fourth transistor serving as a parasitic capacitor. The first bit line and the second bit line has an identical length. The micro-sensor amplifier is coupled to the first bit line and the second bit line for amplifying the micro-signal and performing a logical decision.

The reference voltage is generated by charging a ferro-electric capacitor so that the ferro-electric capacitor holds an amount of electric charges intermediate between logic '1' and logic '0'. The electric charges are then transferred to a capacitor so that the capacitor produces a voltage. The voltage produced by the capacitor is the reference voltage.

Because the amount of electric charges producing the reference voltage is intermediate between logic '1' and logic '0', voltage at logic '1' and voltage at logic '0' are separated from the reference voltage by a clear voltage differential value. Furthermore, the same ferro-electric capacitor is used for producing the reference voltage and holding the data waiting for logic decision. Hence, logic level of data can be accurately determined and edge effect can be avoided.

Because the same ferro-electric capacitor is used for producing the reference voltage and holding the data waiting for logic decision and the amount of electric charges producing the reference voltage is intermediate between logic '1' and logic '0', voltage at logic '1' and voltage at logic '0' are separated from the reference voltage by a clear voltage differential value. Hence, there is no need to add any auxiliary device or use bit lines having different length to create a large voltage differential. Ultimately, size of the integrated circuit can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
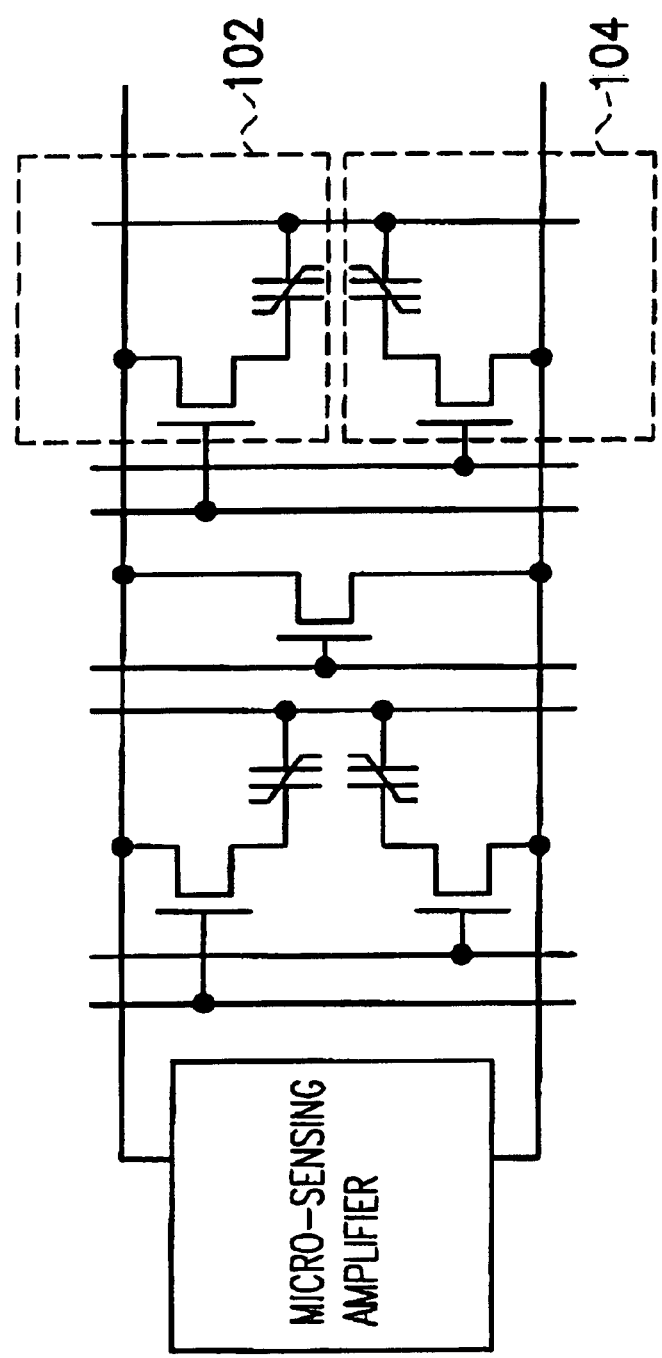
FIG. 1 is a schematic circuit diagram for producing a reference voltage through a pair of dummy cells.
Figure 2:
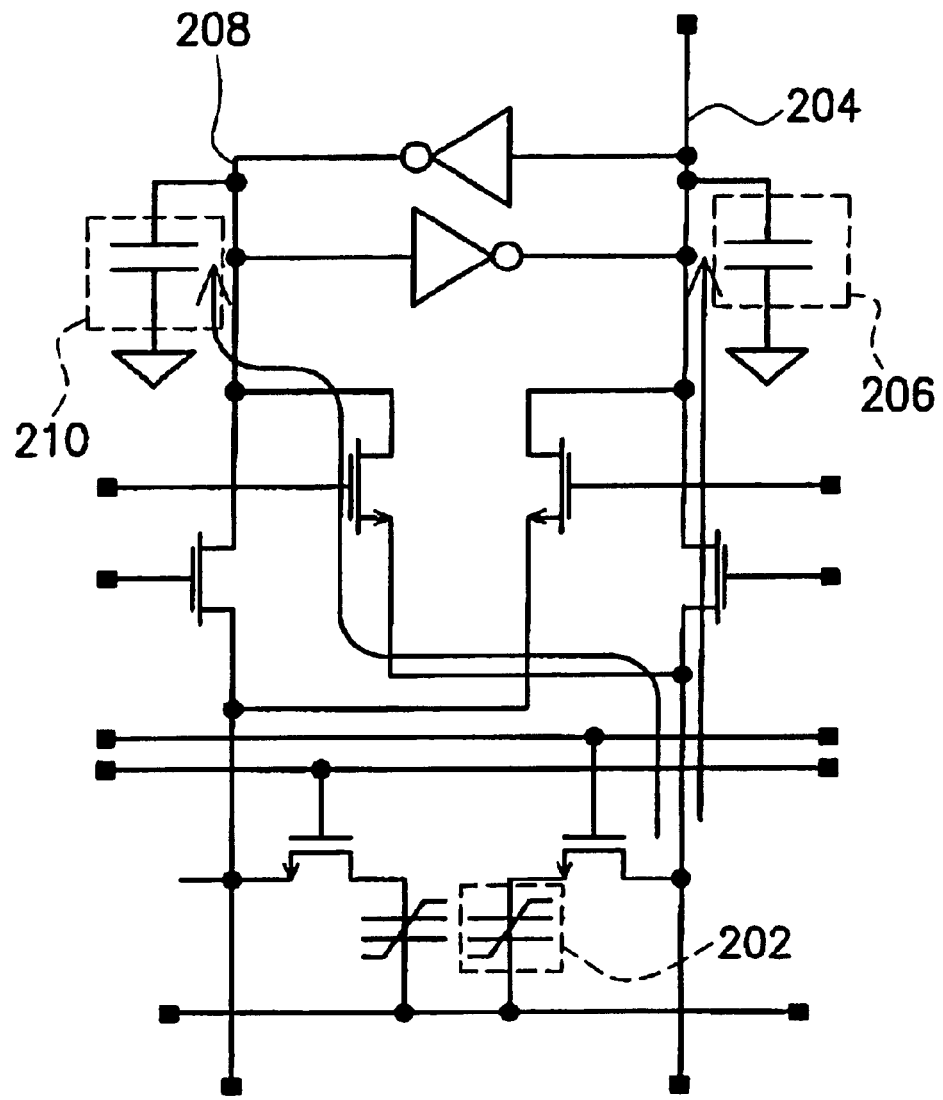
FIG. 2 is a circuit diagram showing a method of deploying the voltage differential between a pair of different bit lines to produce a reference voltage.
Figure 3:
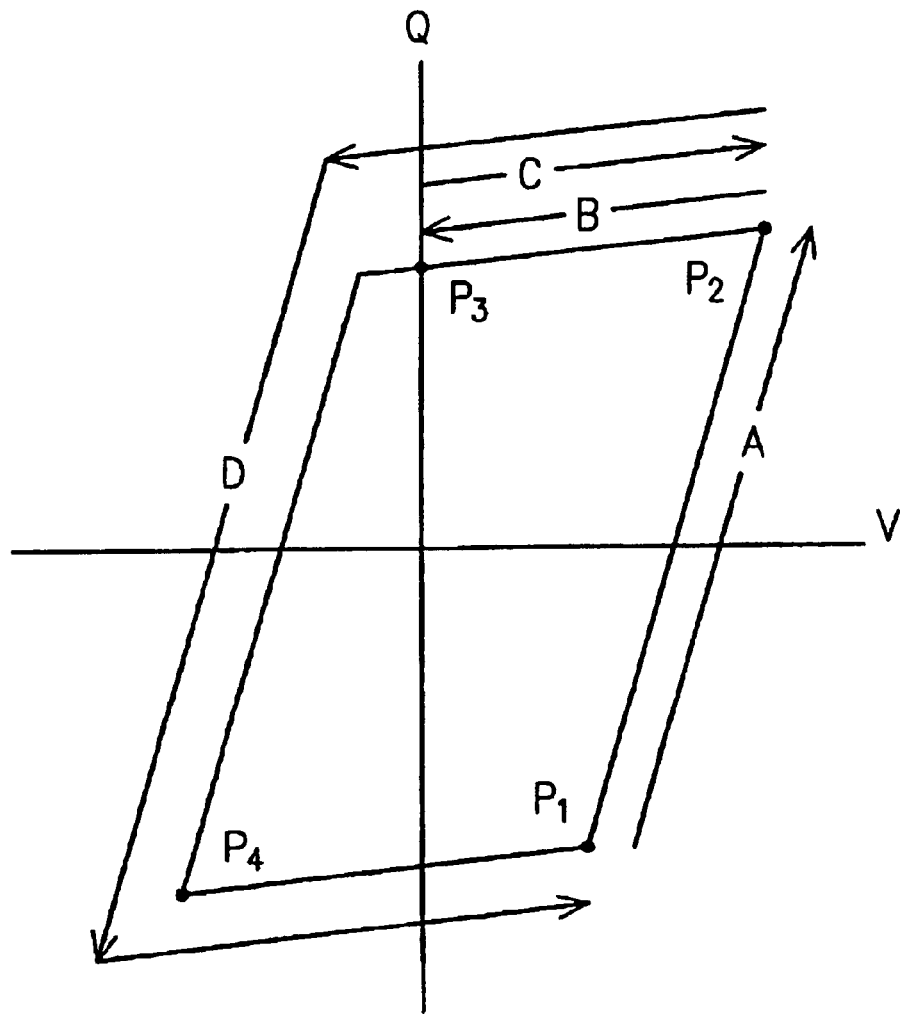
FIG. 3 is graph showing the variation between voltage and electric charge of the ferro-electric capacitor in the circuit shown in FIG. 2.
Figure 4:
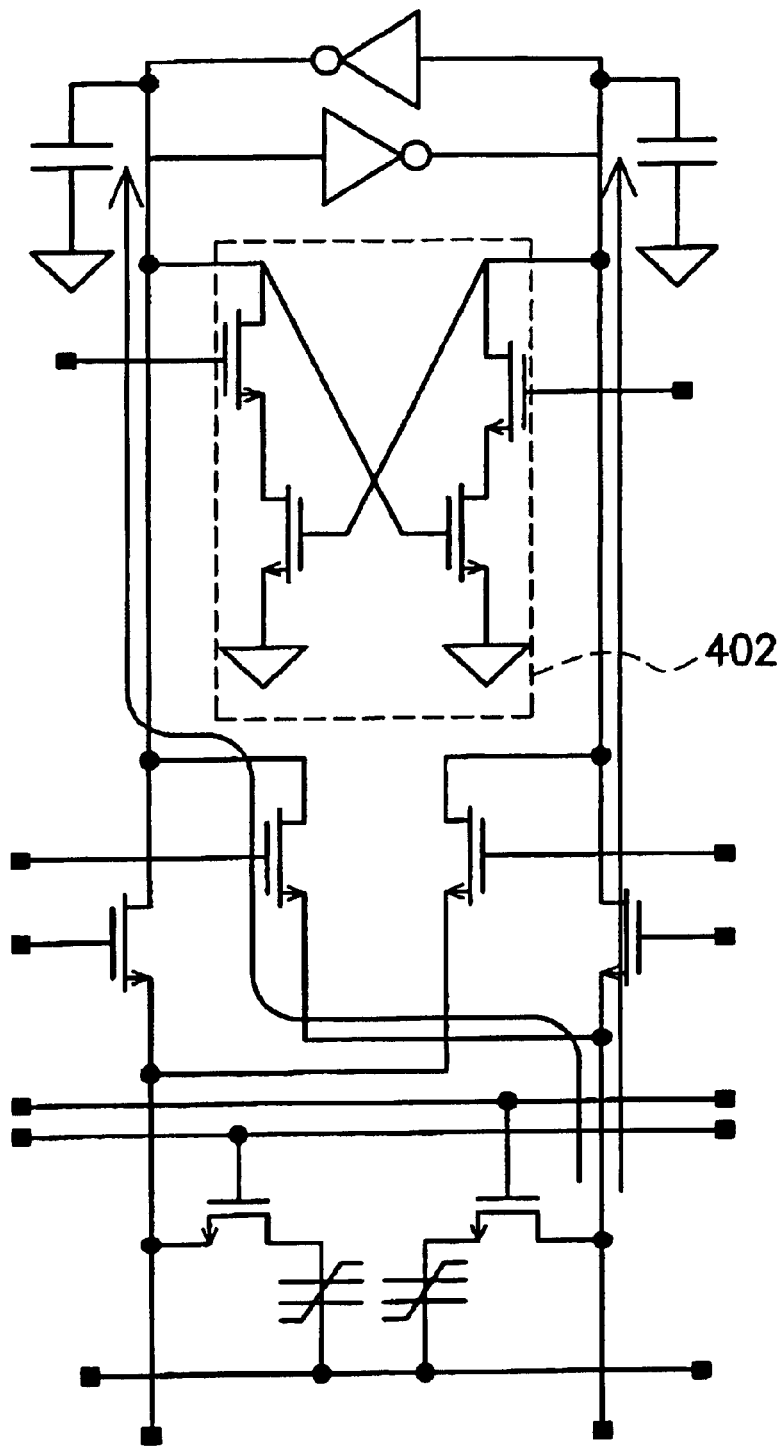
FIG. 4 is a schematic circuit diagram showing a system that uses an auxiliary device to produce voltage differential and hence a reference voltage.

Reference will now be made in detail to the present preferred embodiments of the invention, examples of which are illustrated in the accompanying drawings. Wherever possible, the same reference numbers are used in the drawings and the description to refer to the same or like parts.

Figure 5:
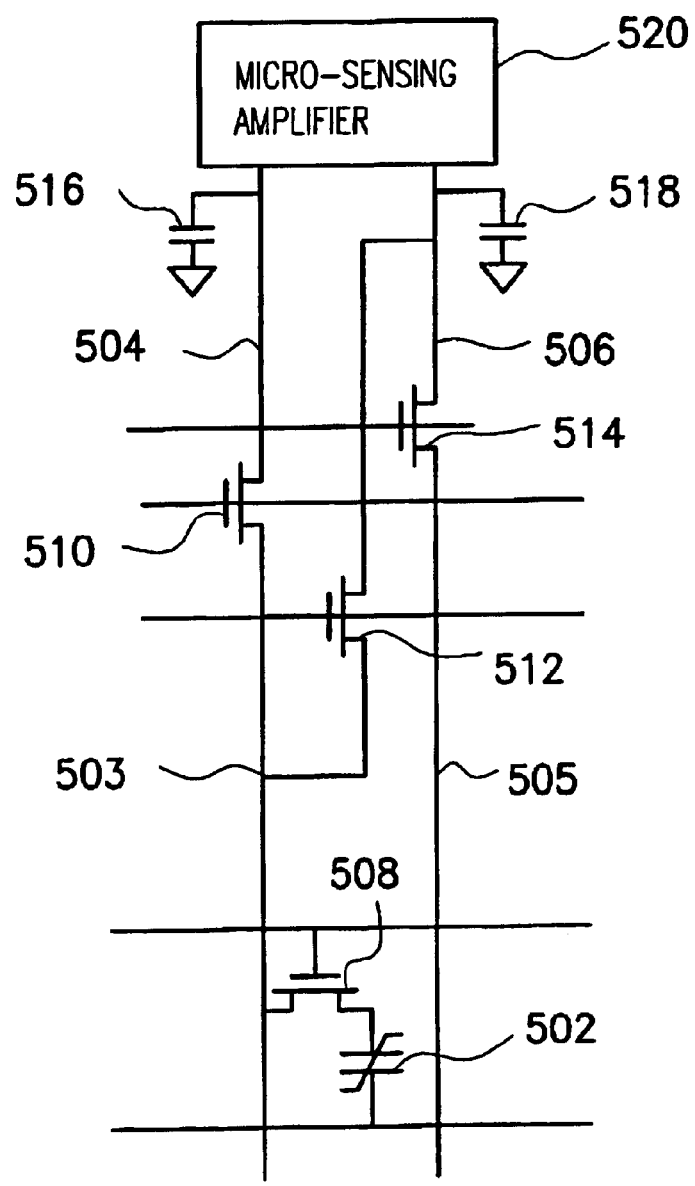
FIG. 5 is a schematic circuit diagram of a device that uses a ferro-electric capacitor for determining logic levels according to one preferred embodiment of this invention.
Figure 6:
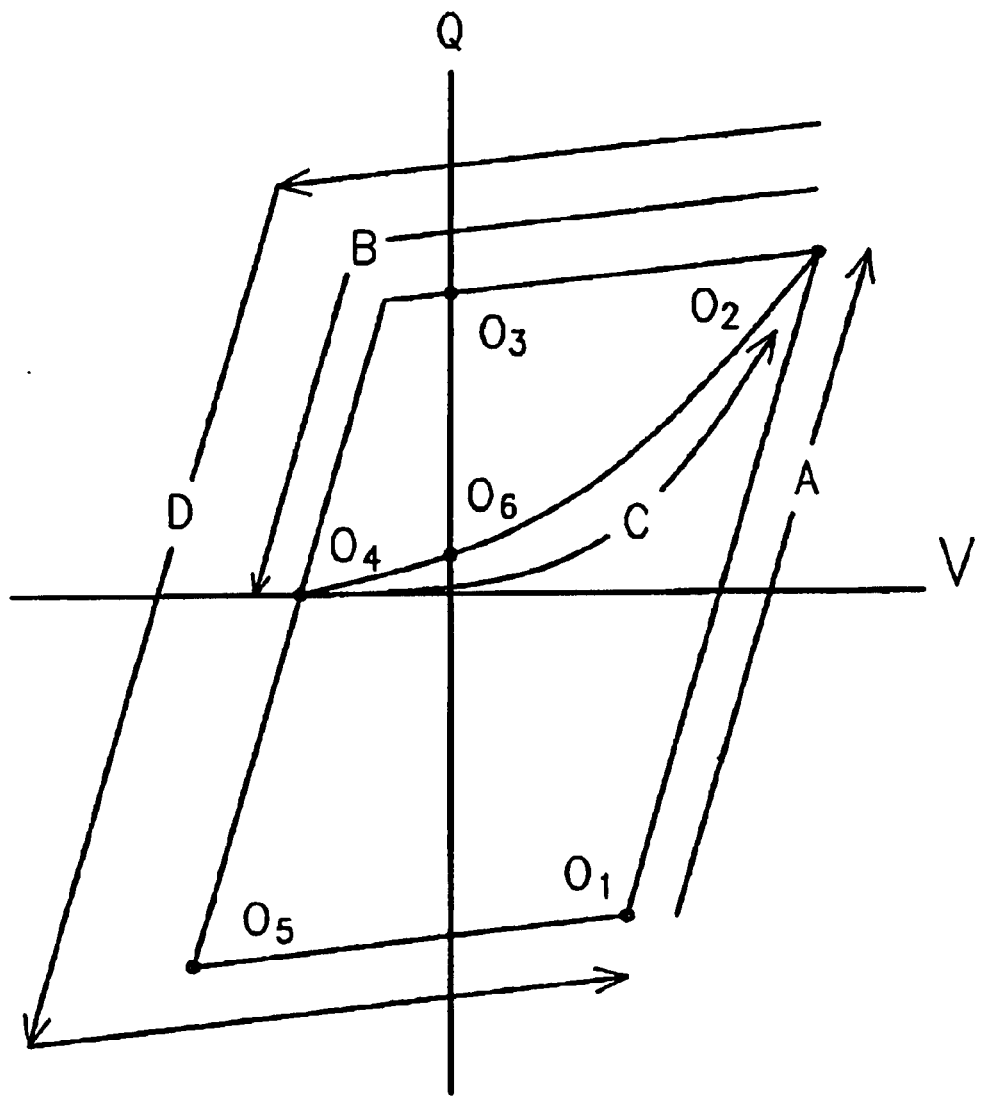
FIG. 6 is graph showing the variation between voltage and electric charge of the ferro-electric capacitor in the circuit shown in FIG. 5.

FIG. 5 is a schematic circuit diagram of a device that uses a ferro-electric capacitor for determining logic levels according to one preferred embodiment of this invention. FIG. 6 is graph showing the variation between voltage and electric charge of the ferro-electric capacitor in the circuit shown in FIG. 5. In this embodiment, the same ferro-electric capacitor is used for holding data charges waiting for logical decision and charges for producing a reference voltage. A micro-sensing amplifier monitors the differential between the data voltage and the reference voltage to determine the exact logic level of the data.

The device includes a ferro-electric capacitor 502, a first bit line 504, a second bit line 506, a first transistor 508, a second transistor 510, a third transistor 512, a fourth transistor 514 and a micro-sensing amplifier 520. The ferro-electric capacitor 502 produces a reference voltage. The first terminal of the first transistor 508 couples with the ferro-electric capacitor 502 to serve as a switch. The second terminal of the second transistor 510 couples with the second terminal of the first transistor 508 to serve as a switch. The second terminal of the third transistor 512 couples with the second terminal of the first transistor 508 to serve as a switch. The first terminal of the fourth transistor 514 couples with the first terminal of the third transistor 512 to serve as a switch. The bit line 504 couples with the first terminal of the second transistor 510 to serve as a parasitic capacitor. The bit line 506 couples with the first terminal of the third transistor 512 to serve as a parasitic capacitor. The micro-sensing amplifier 520 couples with both the first bit line 504 and the second bit line 506 for amplifying micro-signals and exercising logical decision.

Assume there is data charges Q1 inside the ferro-electric capacitor 502 waiting for logical decision. Furthermore, assume the bit lines on each side are of identical length. In other words, the bit lines have an identical parasitic capacitance.

First, the second transistor 510 is switched open while the other transistors are shut. The bit lines 503 and 504 are charged to a high potential level so that subsequent charging time is reduced and operating speed is increased. The first transistor 508 is switched open so that data charges Q1 waiting for logical decision within the ferro-electric capacitor 502 are transferred to the bit lines 503 and 504. Thereafter, the second transistor 510 is shut down so that a portion of the data charges is latched inside the parasitic capacitor 516. Since V=Q/C, the parasitic capacitor 516 generates a voltage V1. The charge/voltage inside the ferro-electric capacitor 502 varies from point $O_1$ to $O_2$ along path A in FIG. 6.

After shutting the first transistor 508, an amount of reference electric charges Q2 intermediate between logic '1' and logic '0' is transferred into the ferro-electric capacitor 502. The charge/voltage inside the ferro-electric capacitor 502 varies from point $O_2$ to $O_4$ via $O_3$ along path B in FIG. 6.

The fourth transistor 514 is switched open while all other transistors are shut. The bit lines 505 and 506 are charged to a high potential so that subsequent charging time is reduced and operating speed is increased. The first transistor 508 and the third transistor 512 are switched open so that the reference charges Q2 within the ferro-electric capacitor 502 is transferred to the bit lines 505 and 506. The fourth transistor 514 is then shut so that a portion of the reference charges Q2 is latched within the parasitic capacitor 520. Since V=V/C, the parasitic capacitor 518 generate a voltage V2. The charge/voltage inside the ferro-electric capacitor 502 varies from point $O_4$ to $O_2$ via $O_6$ along path C in FIG. 6.

The micro-sensing amplifier 520 is next used to determine the data logic level. After logic data decision, the first transistor 508 and the second transistor are switched on so that the charges Q1 in the bit lines 503 and 504 are returned to the ferro-electric capacitor 502. The charge/voltage inside the ferro-electric capacitor 502 varies from point $O_2$ to $O_1$ via $O_3$, $O_4$ and $O_5$ along path D in FIG. 6. Because the parasitic capacitance generated by the bit line on either side are identical and the electric charges producing the reference voltage is intermediate between logic '1' and logic '0', voltage V1 is obviously larger than voltage V2. Hence, V1 is at logic '1'. Using this method, logical decision can be clearly made and the edge effect due to a variation of capacitor property can be avoided without increasing size of the integrated circuit.

In brief, the same ferro-electric capacitor is used for producing the reference voltage and holding the data waiting for logic decision and the amount of electric charges producing the reference voltage is intermediate between logic '1' and logic '0'. Hence, voltage at logic '1' and voltage at logic '0' are separated from the reference voltage by a clear voltage differential value. Ultimately, logic level of data can be accurately determined, edge effect can be avoided and size of the integrated circuit can be reduced.

In conclusion, this invention has the following major advantages:

1. Logic levels are accurately determined so that edge effect due to a variation of capacitor property is avoided.
2. Overall size of integrated circuit is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device having a ferro-electric capacitor therein for determining logical levels, comprising:

a ferro-electric capacitor for producing a reference voltage, wherein the reference voltage is produced by charging a ferro-electric capacitor so that an amount of electric charges within the ferro-electric capacitor is intermediate between an amount of electric charges signifying a logic level '1' and an amount of electric charges signifying a logic level '0', wherein the ferro-electric capacitor is a ferro-electric capacitor for holding data waiting for logical decision, and transferring the electric charges to a capacitor so that the capacitor produces a reference voltage;

a first transistor having a first terminal coupled to the ferro-electric capacitor to serve as a switch;

a second transistor having a second terminal coupled to a second terminal of the first transistor to serve as a switch;

a third transistor having a second terminal coupled to the second terminal of the first transistor to serve as a switch;

a fourth transistor having a first terminal coupled to a first terminal of the third transistor to serve as a switch;

a first bit line coupled to a first terminal of the second transistor to serve as a parasitic capacitor;

a second bit line coupled to the first terminal of the third transistor to serve as a parasitic capacitor; and a micro-sensing amplifier coupled to the first bit line and the second bit line for amplifying micro-signals and perform logical decisions.

2. The device of claim 1, wherein a parasitic capacitance produced by the first bit line is identical to a parasitic capacitance produced by the second bit line.

* * * * *